United States Patent
Takahashi et al.

(10) Patent No.: US 12,089,297 B2
(45) Date of Patent: Sep. 10, 2024

(54) CERAMIC HEATER

(71) Applicant: NGK INSULATORS, LTD., Nagoya (JP)

(72) Inventors: Tomohiro Takahashi, Nagoya (JP); Noboru Kajihara, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 778 days.

(21) Appl. No.: 17/233,919

(22) Filed: Apr. 19, 2021

(65) Prior Publication Data
US 2021/0243848 A1 Aug. 5, 2021

Related U.S. Application Data

(63) Continuation of application No. PCT/JP2019/048644, filed on Dec. 12, 2019.

(30) Foreign Application Priority Data

Dec. 20, 2018 (JP) ................................ 2018-238224

(51) Int. Cl.
*H05B 3/14* (2006.01)
(52) U.S. Cl.
CPC .................................... *H05B 3/143* (2013.01)
(58) Field of Classification Search
CPC .............. H05B 3/283; H05B 2203/002; H05B 2203/037; H05B 3/143; H05B 3/74; H05B 1/0233; H05B 2203/005; H05B 3/02; H05B 3/265; H05B 1/00; H05B 2203/003; H05B 2203/013; H05B 2203/016; H05B 2203/017; G01K 7/02; G01K 13/00; G01K 13/10; G01K 1/14; G01K 1/146; G01K 7/04
USPC .................................. 219/443, 444; 269/293
See application file for complete search history.

(56) References Cited

U.S. PATENT DOCUMENTS

| 2008/0017627 A1 | 1/2008 | Iwata et al. |
| 2010/0163188 A1* | 7/2010 | Tanaka .............. H01L 21/68742 |
| | | 156/345.52 |
| 2012/0211933 A1* | 8/2012 | Goto ................. H01L 21/68757 |
| | | 269/293 |

FOREIGN PATENT DOCUMENTS

| JP | H06-298593 A | 10/1994 |
| JP | 2006-153706 A | 6/2006 |

(Continued)

OTHER PUBLICATIONS

JP 2009064917 A (Year: 2009).*

(Continued)

*Primary Examiner* — Vy T Nguyen
(74) *Attorney, Agent, or Firm* — BURR PATENT LAW, PLLC

(57) ABSTRACT

A ceramic heater includes a ceramic plate incorporating an outer peripheral resistance heating element, and an outer peripheral thermocouple that measures the temperature of an outer peripheral zone by a temperature measurement portion provided at the tip of the outer peripheral thermocouple. The outer peripheral resistance heating element extends out from one of a pair of terminals provided at a center portion of the ceramic plate to the annular outer peripheral zone and reaches the other of the pair of terminals after disposed in the outer peripheral zone while turning back at a plurality of turn-back portions. The temperature measurement portion is disposed at a location in the outer peripheral zone excluding parts where the turn-back portions of the outer peripheral resistance heating element face each other.

10 Claims, 11 Drawing Sheets

(56) References Cited

FOREIGN PATENT DOCUMENTS

| | | |
|---|---|---|
| JP | 2007-142441 A1 | 6/2007 |
| JP | 2010-177595 A1 | 8/2010 |
| JP | 2012-080103 A1 | 4/2012 |
| JP | 2012-160368 A1 | 8/2012 |
| JP | 5501467 B2 | 5/2014 |
| KR | 20-0178800 Y1 | 4/2000 |
| KR | 10-1357928 A | 2/2014 |
| TW | 200614354 A | 5/2006 |
| WO | 2012/039453 A1 | 3/2012 |

OTHER PUBLICATIONS

English translation of the International Preliminary Report on Patentability (Chapter I) dated Jul. 1, 2021 (Application No. PCT/JP2019/048644).
International Search Report and Written Opinion (Application No. PCT/JP2019/048644) dated Mar. 3, 2020.
Taiwanese Office Action (Application No. 108145966) dated Oct. 21, 2020.
Korean Office Action (Application No. 10-2021-7011815) dated Mar. 15, 2023 (with English translation).
Korean Office Action (Application No. 10-2021-7011815) dated Sep. 9, 2022 (with English translation)

\* cited by examiner

CERAMIC HEATER

BACKGROUND OF THE INVENTION

1. Field of the Invention

The present invention relates to a ceramic heater.

2. Description of the Related Art

As a ceramic heater, there is a so-called two-zone heater in which resistance heating elements are independently embedded in each of the inner peripheral side and the outer peripheral side of a disk-shaped ceramic plate having a wafer placement surface (for example, PTL 1). Specifically, the temperature of the inner peripheral side of the ceramic plate is measured by an inner peripheral thermocouple, the temperature of the outer peripheral side is measured by an outer peripheral thermocouple, and the heat generation from each resistance heating element is controlled such that the entire surface of the ceramic plate has a target temperature.

CITATION LIST

Patent Literature

PTL 1: Japanese Patent No. 5501467

SUMMARY OF THE INVENTION

However, in PTL 1, the temperature measured by the outer peripheral thermocouple may not coincide with the actual temperature of the outer peripheral side.

The present invention has been made to solve such problems, and a main object of the present invention is to measure the temperature of an outer peripheral zone with accuracy.

A ceramic heater of the present invention includes:

a disk-shaped ceramic plate having a wafer placement surface;

an outer peripheral resistance heating element incorporated in the ceramic plate and having a shape that extends out from one of a pair of terminals provided at a center portion of the ceramic plate to an annular outer peripheral zone of the ceramic plate and reaches another of the pair of terminals after disposed in the outer peripheral zone while turning back at a plurality of turn-back portions; and an outer peripheral thermocouple that measures a temperature of the outer peripheral zone by a temperature measurement portion provided at a tip of the outer peripheral thermocouple, wherein, when the ceramic plate is viewed from the wafer placement surface, the temperature measurement portion is disposed at a location in the outer peripheral zone excluding a part where the turn-back portions of the outer peripheral resistance heating element face each other.

In the ceramic heater, the part of the outer peripheral zone where the turn-back portions of the outer peripheral resistance heating element face each other easily becomes a singular point because the outer peripheral resistance heating element is not present therein. Thus, in the present invention, the temperature measurement portion of the outer peripheral thermocouple is disposed at a location in the outer peripheral zone excluding the singular point. Consequently, the temperature measurement portion of the outer peripheral thermocouple can measure the temperature of the outer peripheral zone with accuracy.

In the ceramic heater of the present invention, the outer peripheral zone may be divided into a plurality of circular-sector regions by a line segment connecting a center of the ceramic plate and each of the plurality of turn-back portions of the outer peripheral resistance heating element, and the location where the temperature measurement portion is disposed may be provided inside the circular-sector regions. The inside of the circular-sector regions is less affected by the singular point. Thus, the temperature measurement portion of the outer peripheral thermocouple can measure the temperature of the outer peripheral zone with increased accuracy.

In the ceramic heater of the present invention, the location where the temperature measurement portion is disposed may be provided inside a width of the outer peripheral resistance heating element when the ceramic plate is viewed from the wafer placement surface. Consequently, a change in the temperature of the outer peripheral resistance heating element can be detected by the temperature measurement portion of the outer peripheral thermocouple responsively. The "inside the width of the outer peripheral resistance heating element" denotes, for example, inside the width of the coil of the outer peripheral resistance heating element when the outer peripheral resistance heating element has a coil-shape, inside the plane of the outer peripheral resistance heating element when the outer peripheral resistance heating element has a planar shape, and inside the width of an element wire of the mesh of the outer peripheral resistance heating element when the outer peripheral resistance heating element has a mesh shape.

The ceramic heater of the present invention may include a thermocouple passage provided in an inner portion of the ceramic plate to be parallel to the wafer placement surface, the thermocouple passage extending from an insertion port to reach a terminal end location before an outer peripheral surface of the ceramic plate, the insertion port opening in a surface of the center portion of the ceramic plate, the surface being opposite to the wafer placement surface. The terminal end location is a location where the temperature measurement portion of the outer peripheral thermocouple is disposed. A height of the thermocouple passage is constant from the insertion port to the terminal end location. A width of the thermocouple passage is a constant width W1 from the insertion port to a first intermediate location before the terminal end location, is a width gradually narrowed by a tapered surface from the first intermediate location to a second intermediate location on a deep side from the first intermediate location, and is a constant width W2 (<W1) from the second intermediate location to the terminal end location. When a tapered surface with which the height of the thermocouple passage gradually changes is utilized to guide the temperature measurement portion of the outer peripheral thermocouple to the terminal end location, the temperature measurement portion may not move smoothly by coming into contact with the tapered surface if the temperature measurement portion sags down due to gravity. Here, however, since the tapered surface with which the height of the thermocouple passage is constant and the width thereof gradually changes is utilized, the temperature measurement portion can be guided to the terminal end location smoothly while being guided by the tapered surface. At this time, the width W2 is preferably greater than or equal to 1.2 times and smaller than or equal to 2.2 times an outer diameter d of the outer peripheral thermocouple. Consequently, the temperature measurement portion of the outer peripheral thermocouple can be gently held at the terminal end location of the thermocouple passage. The terminal end location may be provided inside the width of the outer peripheral resistance heating element. In this case, when the temperature measurement portion of the outer peripheral thermocouple is in coincide with the terminal end location of the thermocouple passage, a change in the temperature of the outer peripheral resistance heating element can be detected by the temperature measurement portion of the outer peripheral thermocouple responsively.

In the ceramic heater of the present invention, the thermocouple passage may be a passage having a substantially quadrangular cross-section, and a boundary between a ceiling surface and a side surface of the passage may be an R-surface having a radius of curvature of 0.5 mm or more. Consequently, cracks can be suppressed from being generated in the ceramic plate by starting at the boundary between the ceiling surface and the side surface.

In the ceramic heater of the present invention, a ceiling surface of the thermocouple passage may include an inclined step at an intermediate portion between the insertion port and the terminal end location, and a depth of the thermocouple passage from the insertion port to the step of the ceiling surface may be deeper than a depth of the thermocouple passage from the step to the terminal end location. Consequently, it is possible to insert the outer peripheral thermocouple into the thermocouple passage smoothly by utilizing a thermocouple guide. A boundary between the ceiling surface and a standing wall at the terminal end location may be an inclined surface.

In the ceramic heater of the present invention, the temperature measurement portion of the outer peripheral thermocouple may be a convex curved surface, and, of a terminal end surface of the thermocouple passage, a part in contact with the temperature measurement portion of the outer peripheral thermocouple may be a concave curved surface. Consequently, the temperature measurement portion of the outer peripheral thermocouple is in surface contact with the terminal end surface, which is a desired measurement point, of the thermocouple passage or is in contact therewith in a state similar to surface contact. Thus, accuracy in temperature measurement is improved.

In the ceramic heater of the present invention, a gap between the thermocouple passage and each of the pair of terminals may be 2 mm or more. Consequently, cracks can be prevented from being generated in the ceramic plate due to an excessively narrow space between the thermocouple passage and each of the pair of terminals.

In the ceramic heater of the present invention, a wall of the thermocouple passage on a side of the insertion port may be curved from a rear surface of the ceramic plate opposite to the wafer placement surface toward a deep side of the thermocouple passage. Consequently, it is possible without using the thermocouple guide to insert the outer peripheral thermocouple into the thermocouple passage smoothly by utilizing the curved wall on the side of the insertion port.

The ceramic heater of the present invention may include: an inner peripheral resistance heating element incorporated in the ceramic plate and having a shape that extends from one of a pair of terminals provided at a center portion of the ceramic plate to reach another of the pair of terminals after disposed in a circular inner peripheral zone of the ceramic plate while turning back at a plurality of turn-back portions; and an inner peripheral thermocouple that measures a temperature of the inner peripheral zone by a temperature measurement portion provided at a tip of the inner peripheral thermocouple. In this case, the temperature measurement portion of the inner peripheral thermocouple is preferably disposed at a location excluding a part where the turn-back portions of the inner peripheral resistance heating element face each other. The location where the temperature measurement portion of the inner peripheral thermocouple is disposed is preferably provided inside the width of the inner peripheral resistance heating element when the ceramic plate is viewed from the wafer placement surface.

DETAILED DESCRIPTION OF THE INVENTION

Figure 1:
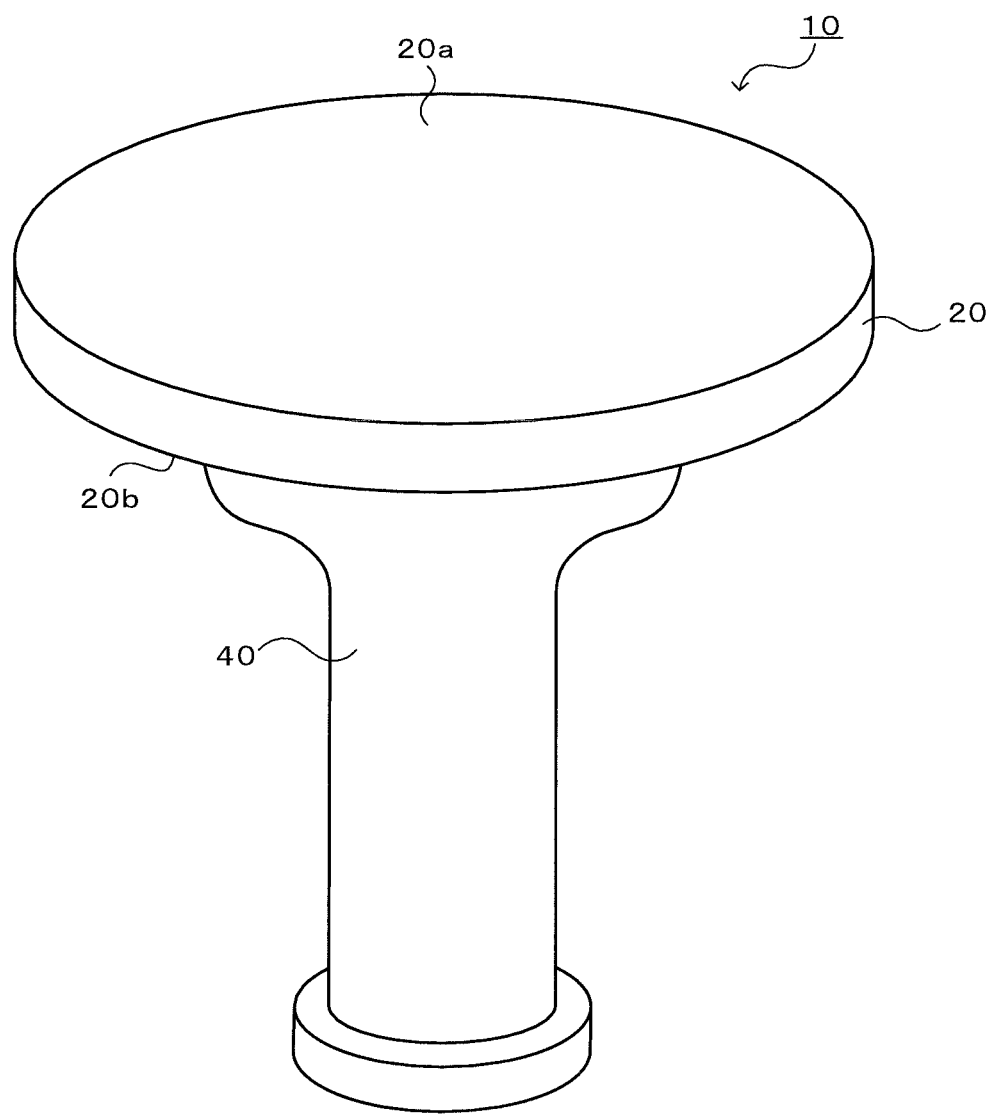
FIG. 1 is a perspective view of a ceramic heater 10.
Figure 2:
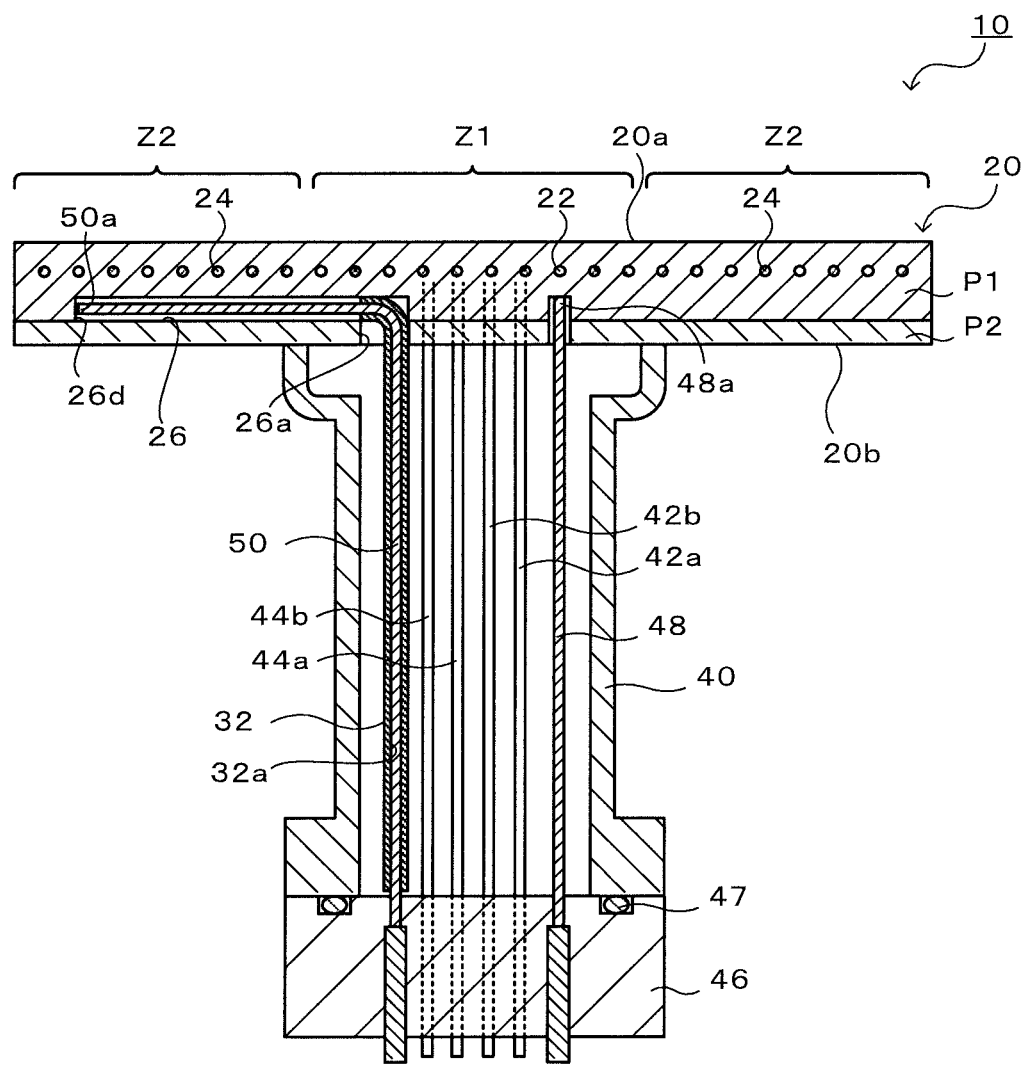
FIG. 2 is a longitudinal sectional view of the ceramic heater 10.
Figure 3:
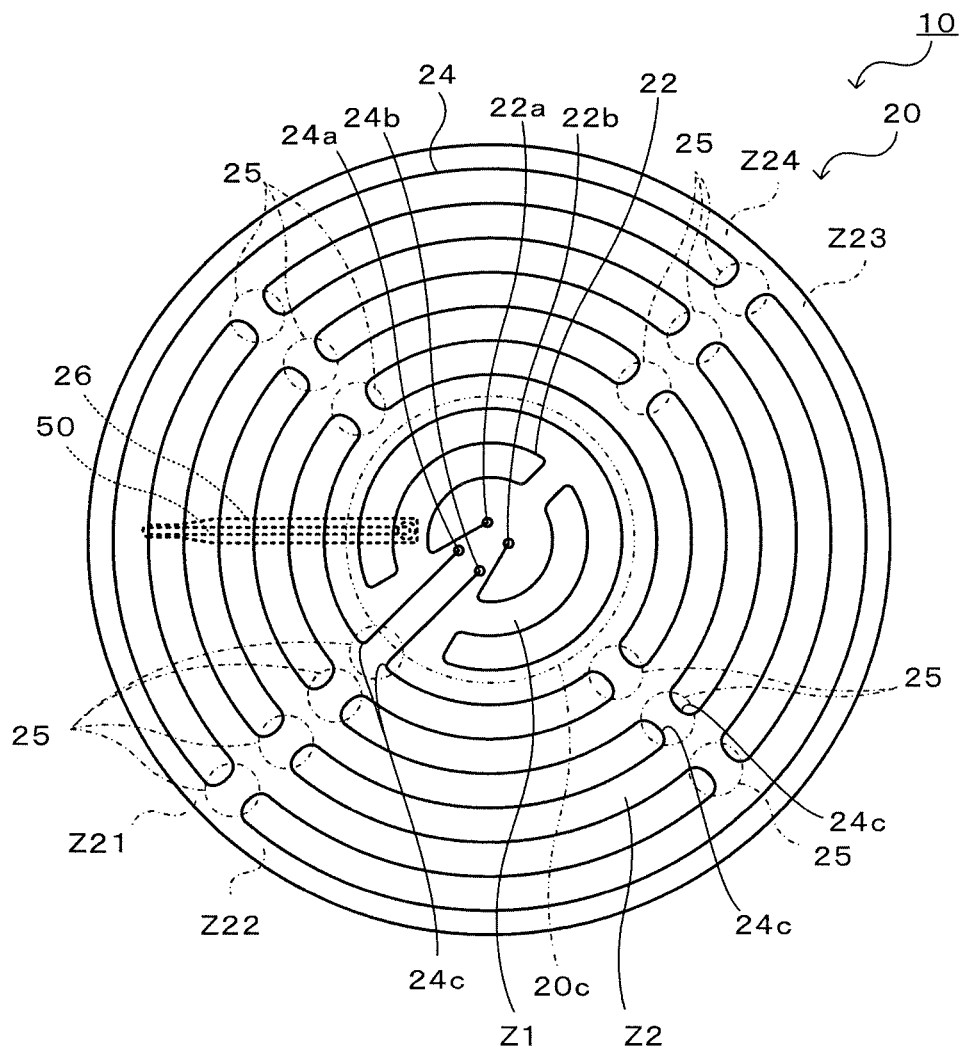
FIG. 3 is a sectional view when a ceramic plate 20 is horizontally cut along resistance heating elements 22 and 24 and viewed from above.
Figure 4:
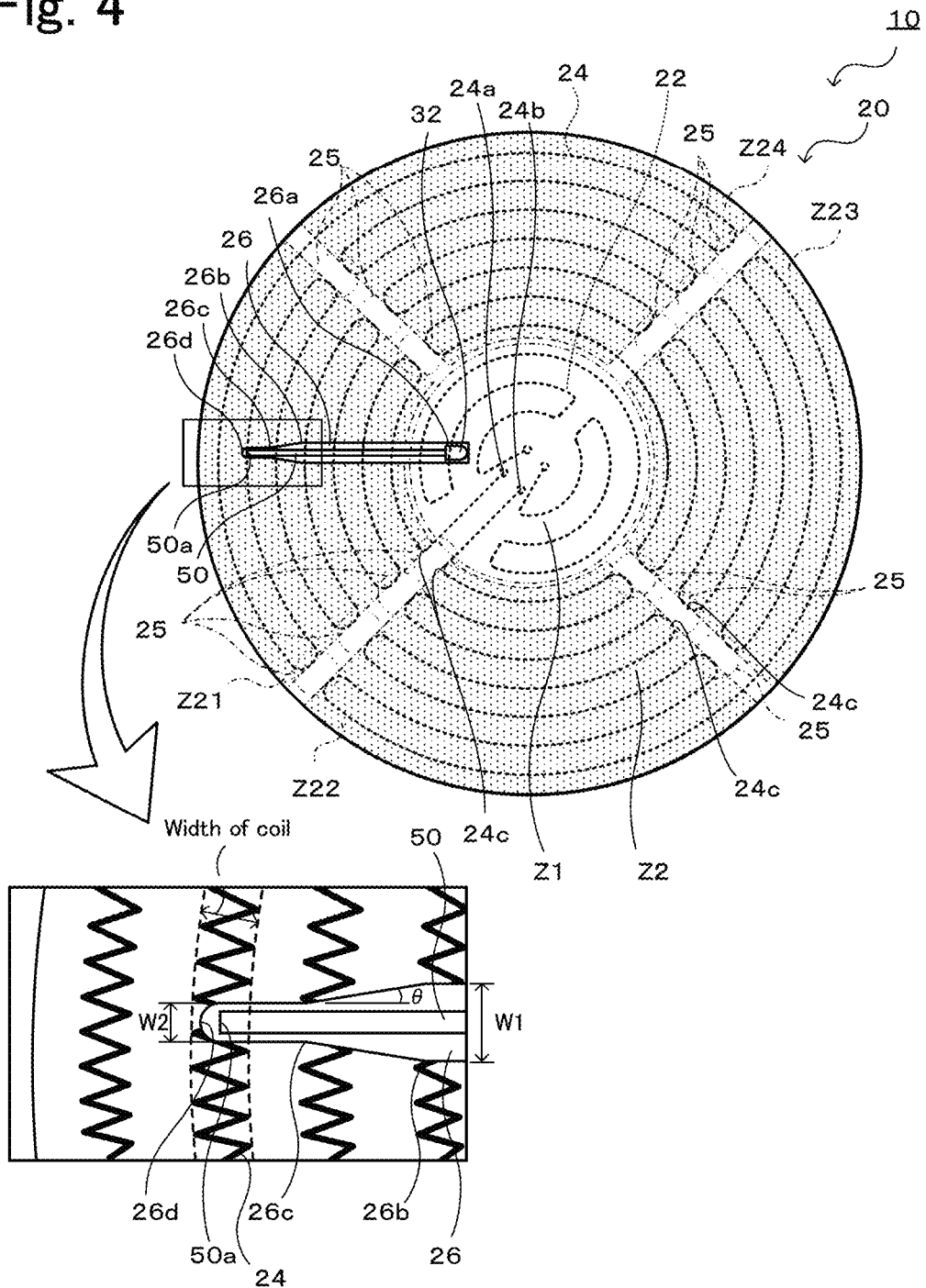
FIG. 4 is a sectional view when the ceramic plate 20 is horizontally cut along a thermocouple passage 26 and viewed from above.

A suitable embodiment of the present invention will be described below with reference to the drawings. FIG. 1 is a perspective view of a ceramic heater 10, FIG. 2 is a longitudinal sectional view (a sectional view when the ceramic heater 10 is cut along a plane including the center axis) of the ceramic heater 10, FIG. 3 is a sectional view when a ceramic plate 20 is horizontally cut along resistance heating elements 22 and 24 and viewed from above, and FIG. 4 is a sectional view when the ceramic plate 20 is horizontally cut along a thermocouple passage 26 and viewed from above. FIG. 3 and FIG. 4 substantially illustrate a state when the ceramic plate 20 is viewed from a wafer placement surface 20a. In FIG. 3 and FIG. 4, hatching that indicates sections is omitted. In FIG. 4, the resistance heating elements 22 and 24 are indicated by dotted lines for convenience of description.

The ceramic heater 10 is used for heating a wafer to be subjected to processing such as etching or CVD and is installed in a vacuum chamber (not illustrated). The ceramic heater 10 includes the disk-shaped ceramic plate 20 having the wafer placement surface 20a, and a cylindrical shaft 40 bonded to a surface (rear surface) 20b opposite to the wafer placement surface 20a of the ceramic plate 20.

The ceramic plate 20 is a disk-shaped plate formed of a ceramic represented by aluminum nitride, alumina, and the like. The ceramic plate 20 is divided into a small circular inner peripheral zone Z1 and an annular outer peripheral zone Z2 by a virtual boundary 20c (refer to FIG. 3) concentric with the ceramic plate 20. An inner peripheral resistance heating element 22 is embedded in the inner peripheral zone Z1 of the ceramic plate 20, and an outer peripheral resistance heating element 24 is embedded in the outer peripheral zone Z2. Both of the resistance heating elements 22 and 24 are each constituted by a coil containing, for example, molybdenum, tungsten, or tungsten carbide, as a main component. As illustrated in FIG. 2, the ceramic plate 20 is produced by surface-bonding an upper plate P1 and a lower plate P2 thinner than the upper plate P1, which will be described later.

As illustrated in FIG. 3, the inner peripheral resistance heating element 22 is formed to start from one of a pair of terminals 22a and 22b disposed at a center portion of the ceramic plate 20 and reach the other of the pair of terminals 22a and 22b after disposed in a substantially entire region of the inner peripheral zone Z1 while turning back at a plurality of turn-back portions in a one-stroke pattern.

As illustrated in FIG. 3, the outer peripheral resistance heating element 24 is formed to start from one of a pair of terminals 24a and 24b disposed at a center portion of the ceramic plate 20 and reach the other of the pair of terminals 24a and 24b after disposed in a substantially entire region of the outer peripheral zone Z2 while turning back at a plurality of turn-back portions 24c in a one-stroke pattern.

As illustrated in FIG. 2, in the inner portion of the ceramic plate 20, the thermocouple passage 26 is provided parallel to the wafer placement surface 20a in the radial direction of the ceramic plate 20. The thermocouple passage 26 is a passage extending from an insertion port 26a for inserting an outer peripheral thermocouple 50 disposed in the rear surface 20b on the center side of the ceramic plate 20, to reach a terminal end location 26d before the outer peripheral surface of the ceramic plate 20. The terminal end location 26d is a location where a temperature measurement portion 50a provided at the tip of the outer peripheral thermocouple 50 is disposed. As illustrated in FIG. 3 and FIG. 4, when the ceramic plate 20 is viewed from the wafer placement surface 20a, the terminal end location 26d is set at a location in the outer peripheral zone Z2 excluding parts 25 (circles of one-dot chain lines in FIG. 3 and FIG. 4) where the turn-back portions 24c of the outer peripheral resistance heating element 24 face each other. Here, the outer peripheral zone 22 is divided into a plurality of circular-sector regions Z21 to Z24 (the shaded parts in FIG. 3 and FIG. 4) by line segments connecting the center of the ceramic plate 20 and each of the plurality of turn-back portions 24c of the outer peripheral resistance heating element 24. The terminal end location 26d is provided in the inner side of any (the circular-sector region Z21 in the present embodiment) of the plurality of circular-sector regions Z21 to 224 and, as illustrated in the partially enlarged view of FIG. 4, is provided to be inside the width of a coil constituting the outer peripheral resistance heating element 24.

The height of the thermocouple passage 26 is constant from the insertion port 26a to the terminal end location 26d. Meanwhile, as illustrated in FIG. 4, the width of the thermocouple passage 26 is a constant width W1 from the insertion port 26a to a first intermediate location 26b before the terminal end location 26d, is a width gradually narrowed by a tapered surface from the first intermediate location 26b to a second intermediate location 26c on a deep side from the first intermediate location 26b, and is a constant width W2 (<W1) from the second intermediate location 26c to the terminal end location 26d. The width W2 is preferably set to be greater than or equal to 1.2 times and smaller than or equal to 2.2 times an outer diameter d of the outer peripheral thermocouple 50. Consequently, the temperature measurement portion 50a can be gently held at the terminal end location 26d. For example, when the outer diameter of the ceramic plate 20 is about 300 mm and the outer diameter d of the outer peripheral thermocouple 50 is 1 mm, the height may be 2 to 3 mm (for example, 2.0 mm or 2.75 mm), W1 may be 3 to 3.5 mm (for example 3.2 mm), and W2 may be 1.4 to 2.4 mm (for example, 2.0 mm). A distance from the first intermediate location 26b to the second intermediate location 26c may be 10 mm, and a distance from the second intermediate location 26c to the terminal end location 26d may be 10 mm. To cause the temperature measurement portion 50a of the outer peripheral thermocouple 50 to smoothly reach the terminal end location 26d of the thermocouple passage 26, a gradient θ of the tapered surface from the first intermediate location 26b to the second intermediate location 26c is preferably 2° or more and 5° or less and is more preferably 3° or more and 4° or less (for example, 3.4°).

As illustrated in FIG. 2, at the rear surface of the ceramic plate 20, a pipe-shaped thermocouple guide 32 having a guide hole 32a therein is attached to the insertion port 26a of the thermocouple passage 26. The thermocouple guide 32 is formed in an L-shape whose direction changes from the up-down direction to the horizontal direction by curving, and a horizontal part is attached to the insertion port 26a. The thermocouple guide 32 is formed of stainless steel, ceramics, or the like. As a method of attaching the thermocouple guide 32 to the insertion port 26a, for example, diffusion bonding, brazing, screwing, or the like can be employed, or only fitting without particularly bonding may be employed.

As with the ceramic plate 20, the cylindrical shaft 40 is formed of ceramic represented by aluminum nitride, alumina, and the like. The cylindrical shaft 40 is diffusion bonded at the upper end thereof to the ceramic plate 20 and, as illustrated in FIG. 2, is connected at the lower end thereof to a support base 46 air-tightly with an O-ring 47 interposed therebetween. In the inner portion of the cylindrical shaft 40, there are disposed power supply rods 42a and 42b respectively connected to the pair of terminals 22a and 22b of the inner peripheral resistance heating element 22, and power supply rods 44a and 44b respectively connected to the pair of terminals 24a and 24b of the outer peripheral resistance heating element 24. The power supply rods 42a, 42b, 44a, and 44b penetrate the support base 46 in the up-down direction. In the inner portion of the cylindrical shaft 40, there are also disposed an inner peripheral thermocouple 48 for measuring the temperature of the vicinity of the center of the ceramic plate 20, and the outer peripheral thermocouple 50 for measuring the temperature of the vicinity of the outer periphery of the ceramic plate 20. The inner peripheral thermocouple 48 penetrates the support base 46 in the up-down direction and is inserted into a recess provided at the center of the rear surface of the ceramic plate 20, and a temperature measurement portion 48a at the tip of the inner peripheral thermocouple 48 is in contact with the ceramic plate 20. The outer peripheral thermocouple 50 is a sheath thermocouple, penetrates the support base 46 in the up-down direction, and passes through the guide hole 32a of the thermocouple guide 32 and the thermocouple passage 26, and the temperature measurement portion 50a at the tip of the outer peripheral thermocouple 50 reaches the terminal end location 26d of the thermocouple passage 26. The outer peripheral thermocouple 50 extends in the up-down direction in the inner portion of the cylindrical shaft 40 but extends in the horizontal direction in the inner portion of the thermocouple passage 26 by being curved by the thermocouple guide 32.

Figure 5:
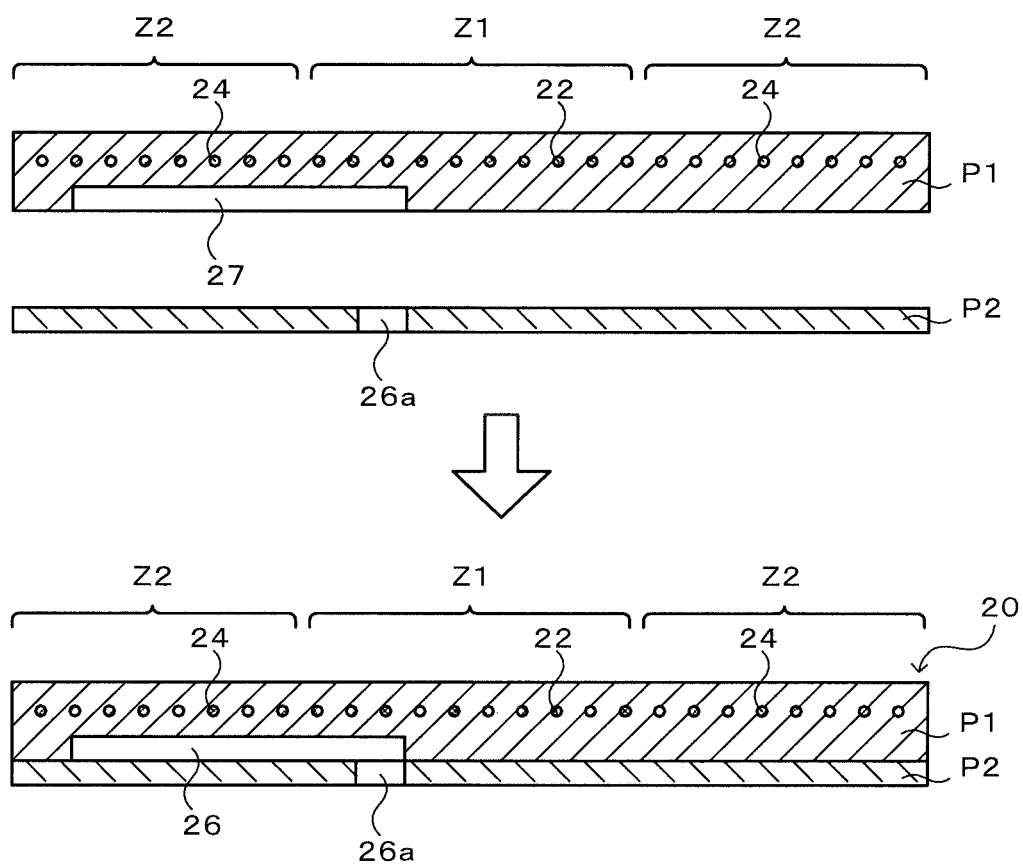
FIG. 5 is an illustration of manufacturing steps of the ceramic plate 20.
Figure 6:
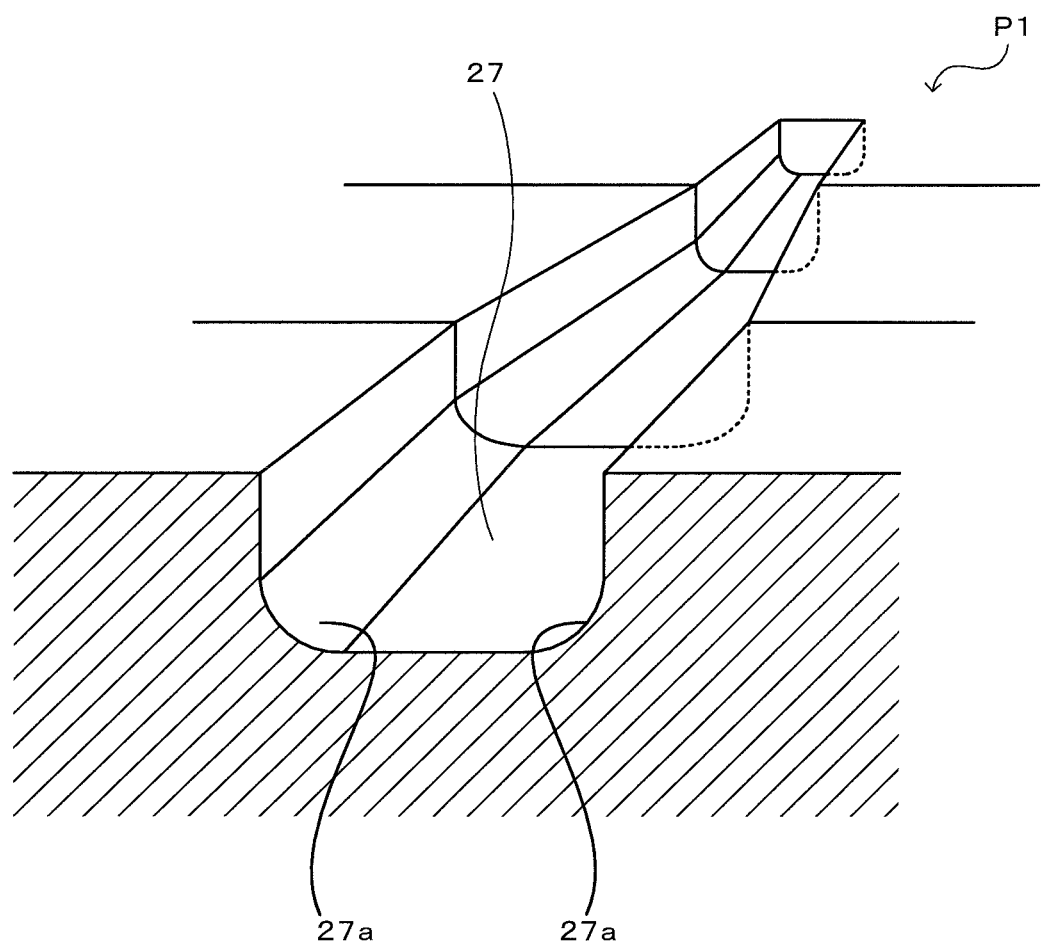
FIG. 6 is a perspective view of a passage groove 27 provided on an upper plate P1.

Next, an example of manufacture of the ceramic heater 10 will be described. As illustrated in FIG. 5, the ceramic plate 20 is produced by surface-bonding the upper plate P1 and the lower plate P2 thinner than the upper plate P1 to each other. The upper plate P1 incorporates the inner peripheral resistance heating element 22 in the inner peripheral zone Z1, incorporates the outer peripheral resistance heating element 24 in the outer peripheral zone 22, and has a passage groove 27 on the rear surface. The passage groove 27 serves as the thermocouple passage 26 as a result of the flat lower plate P2 being surface bonded to the rear surface of the upper plate P1. Thus, the depth and the width of the passage groove 27 are formed similarly to the above-described thermocouple passage 26. FIG. 6 is a perspective view of the passage groove 27 when the rear surface of the upper plate P1 is directed upward. The passage groove 27 is a groove having a substantially quadrangular cross-section, and corner portions 27a on both sides of the passage groove 27 are R-chamfered to have a predetermined radius of curvature (preferably, 0.5 mm or more, for example, 1 mm). Thus, corner portions of the upper surface (ceiling) of the thermocouple passage 26 are also R-chamfered. The insertion port 26a of the thermocouple passage 26 is previously formed in the lower plate P2.

Next, a hole is formed from the rear surface of the ceramic plate 20 toward each of the terminals 22a and 22b of the inner peripheral resistance heating element 22 and the terminals 24a and 24b of the outer peripheral resistance heating element 24, and each terminal is exposed in the hole. The recess for inserting the inner peripheral thermocouple 48 thereinto is formed at the center of the rear surface of the ceramic plate 20. The thermocouple guide 32 is fitted into the insertion port 26a. Next, the cylindrical shaft 40 is positioned at the center of the ceramic plate 20. Then, in this state, the thermocouple guide 32 and the cylindrical shaft 40 are diffusion bonded to the ceramic plate 20. These members are all formed of the same material, and it is thus possible to perform diffusion bonding of all of the members in one step. The ceramic plate 20 and the cylindrical shaft 40 may be diffusion bonded to each other before the thermocouple guide 32 is fitted into the insertion port 26a, and then, the thermocouple guide 32 may be fitted into the insertion port 26a.

Then, in the inner portion of the cylindrical shaft 40, the power supply rods 42a, 42b, 44a, and 44b are respectively connected to the terminals 22a, 22b, 24a, and 24b, and the temperature measurement portion 48a of the inner peripheral thermocouple 48 is inserted into the recess of the ceramic plate 20. The temperature measurement portion of the outer peripheral thermocouple 50 is inserted into the thermocouple passage 26 through the guide hole 32a of the thermocouple guide 32 to reach the terminal end location 26d of the thermocouple passage 26. Here, the outer peripheral thermocouple 50 changes the direction thereof from the up-down direction to the horizontal direction by curving along the guide hole 32a, enters the thermocouple passage 26, passes through the part having the wide width W1, and is guided to the part having the narrow width W2 while being guided by the tapered surface. Consequently, the temperature measurement portion 50a at the tip of the outer peripheral thermocouple 50 reaches the terminal end location 26d.

Next, a usage example of the ceramic heater 10 will be described. First, the ceramic heater 10 is installed in a vacuum chamber (not illustrated), and a wafer is placed on the wafer placement surface 20a of the ceramic heater 10. Then, power to be supplied to the inner peripheral resistance heating element 22 is adjusted such that a temperature detected by the inner peripheral thermocouple 48 is a predetermined inner peripheral target temperature, and power to be supplied to the outer peripheral resistance heating element 24 is adjusted such that a temperature detected by the outer peripheral thermocouple 50 is a predetermined outer peripheral target temperature. Consequently, the temperature of the wafer is controlled to be a desired temperature. Then, the inside of the vacuum chamber is set to be a vacuum atmosphere or a reduced-pressure atmosphere, plasma is generated in the vacuum chamber, and CVD film formation or etching is performed on a wafer by utilizing the plasma.

In the ceramic heater 10 of the present embodiment described above, the parts 25 of the outer peripheral zone Z2 where the turn-back portions 24c of the outer peripheral resistance heating element 24 face each other easily become singular points because the outer peripheral resistance heating element 24 is not present therein. Thus, the temperature measurement portion 50a of the outer peripheral thermocouple 50 is disposed at a location in the outer peripheral zone 22 excluding the parts 25. Consequently, the temperature measurement portion 50a of the outer peripheral thermocouple 50 can measure the temperature of the outer peripheral zone Z2 with accuracy.

The outer peripheral zone 22 is divided into the plurality of circular-sector regions Z21 to Z24 by the line segments connecting the center of the ceramic plate 20 and each of the plurality of turn-back portions 24c of the outer peripheral resistance heating element 24. The location where the temperature measurement portion 50a is disposed is provided in the inner side of any (the circular-sector region 221 in the present embodiment) of the plurality of circular-sector regions Z21 to Z24. The inner side of the circular-sector regions Z21 to Z24 is less affected by the singular points. Thus, the temperature measurement portion 50a of the outer peripheral thermocouple 50 can measure the temperature of the outer peripheral zone Z2 with increased accuracy.

Further, the location where the temperature measurement portion 50a is disposed is provided inside the width of the coil of the outer peripheral resistance heating element 24 when the ceramic plate 20 is viewed from the wafer placement surface 20a. Thus, a change in the temperature of the outer peripheral resistance heating element 24 can be detected by the temperature measurement portion 50a of the outer peripheral thermocouple 50 responsively.

Furthermore, when a tapered surface with which the height of the thermocouple passage 26 gradually changes is utilized to guide the temperature measurement portion 50a of the outer peripheral thermocouple 50 from the insertion port 26a to the terminal end location 26d of the thermocouple passage 26, the temperature measurement portion 50a may not move smoothly by coming into contact with the tapered surface if the temperature measurement portion 50a sags down due to gravity. In the present embodiment, however, since the thermocouple passage 26 utilizes the tapered surface with which the height thereof is constant and the width thereof gradually changes, the temperature measurement portion 50a can be guided to the terminal end location 26d smoothly while being guided by the tapered surface.

In addition, since the width W2 is set to greater than or equal to 1.2 times and smaller than or equal to 2.2 times the outer diameter d of the outer peripheral thermocouple, the temperature measurement portion 50a of the outer peripheral thermocouple 50 can be gently held at the terminal end location 26d of the thermocouple passage 26.

Furthermore, since the corner portions of the upper surface (ceiling) of the thermocouple passage 26 are R-chamfered to have a round shape, the temperature measurement portion 50a is not caught by the corner portions, and the temperature measurement portion 50a can be guided to the terminal end location 26d smoothly. Moreover, since thermal stress is not concentrated at the corner portions, cracks that start at the corner portions are not easily generated.

Furthermore, the thermocouple passage 26 is a passage having a substantially quadrangular cross-section, and boundaries (the corner portions 27a) between the ceiling surface and the side surfaces are R-surfaces having a radius of curvature of 0.5 mm. Thus, cracks can be suppressed from being generated in the ceramic plate 20 by starting at the boundaries between the ceiling surface and the side surfaces. Specifically, in bonding between the upper plate P1 and the lower plate P2 under heating and pressurizing conditions (for example, at a temperature of 1600° C. or more with a pressure of 7.0 kg/cm$^2$ or more), cracks can be suppressed from being generated in the ceramic plate 20 by starting at the corner portions 27a. Incidentally, a crack was generated when the radius of curvature of the corner portions 27a was set to 0.1 mm or 0.3 mm but was not generated when the radius of curvature was set to 0.5 mm, 0.7 mm, or 0.9 mm.

The present invention is not limited to the above-described embodiment, and can be carried out by various modes as long as they belong to the technical scope of the invention.

For example, in the above-described embodiment, both of the resistance heating elements 22 and 24 have a coil shape; however, the shape is not limited in particular to the coil shape and may be, for example, a planar shape (a ribbon shape and the like) or may be a mesh shape. Planar resistance heating elements can be formed by printing. When the outer peripheral resistance heating element 24 having a planar shape is employed, it is preferable that the temperature measurement portion 50a of the outer peripheral thermocouple 50 be disposed inside the plane of the outer peripheral resistance heating element 24 when the ceramic plate 20 is viewed from the wafer placement surface 20a. When the outer peripheral resistance heating element 24 having a mesh shape is employed, it is preferable that the temperature measurement portion 50a of the outer peripheral thermocouple 50 be disposed inside the width of an element wire constituting the mesh when the ceramic plate 20 is viewed from the wafer placement surface 20a.

In the above-described embodiment, the outer peripheral resistance heating element 24 is disposed in the entirety of the outer peripheral zone 22; however, the outer peripheral zone Z2 may be divided into a plurality of small zones, and an outer peripheral resistance heating element 24 may be disposed in each of the small zones. In this case, the temperature measurement portion 50a of the outer peripheral thermocouple 50 is disposed at a location excluding, in addition to parts where turn-back portions present in each of the small zones face each other, parts (between the small zones) where the turn-back portions of the two mutually adjacent small zones face each other.

In the above-described embodiment, the ceramic plate 20 may incorporate, in addition to the resistance heating elements 22 and 24, an electrostatic electrode. Consequently, it is possible to electrostatically attract a water to the wafer placement surface 20a by applying a voltage to the electrostatic electrode after placing the wafer on the wafer placement surface 20a. Alternatively, the ceramic plate 20 may incorporate an RF electrode. In this case, a shower head (not illustrated) is disposed above the wafer placement surface 20a with a space therebetween, and high-frequency power is supplied between parallel plate electrodes constituted by the shower head and the RF electrode. Plasma is thereby generated, and it is possible to perform CVD film formation or etching on a wafer by utilizing the plasma. The electrostatic electrode may also serve as the RF electrode.

In the above-described embodiment, the cross-section of the passage groove 27 has a quadrangular shape, and both of the corner portions 27a are R-chamfered; however, the cross-section of the passage groove 27 may have a semicircular shape. In this case, the ceiling of the thermocouple passage 26 has a shape without corner portions, and thus, while the temperature measurement portion 50a of the outer peripheral thermocouple 50 is guided to the terminal end location 26d of the thermocouple passage 26, the temperature measurement portion 50a is not caught by the ceiling of the thermocouple passage 26.

In the above-described embodiment, the length of the thermocouple guide 32 in the up-down direction is set to be substantially equal to the height of the cylindrical shaft 40; however, the length may be shorter or longer than the height of the cylindrical shaft 40.

In the above-described embodiment, it is preferable that the temperature measurement portion 48a of the inner peripheral thermocouple 48 be also disposed at a location excluding the parts where the turn-back portions of the inner peripheral resistance heating element 22 face each other and be provided inside the coil width of the inner peripheral resistance heating element 22.

In the above-described embodiment, the thermocouple guide 32 is attached to the insertion port 26a of the thermocouple passage 26; however, the thermocouple guide 32 may be disposed at the insertion port 26a of the thermocouple passage 26 when the outer peripheral thermocouple 50 is to be inserted into the thermocouple passage 26, and the thermocouple guide 32 may be removed after the outer peripheral thermocouple 50 is inserted into the thermocouple passage 26. Alternatively, the outer peripheral thermocouple 50 may be inserted into the thermocouple passage 26 without using the thermocouple guide 32.

In the above-described embodiment, the thermocouple passage 26 may be a passage having a substantially quadrangular cross-section and a breadth that is constant from the insertion port 26a to the terminal end location 26d. The boundaries between the terminal end surface (the standing wall at the terminal end location 26d) of the thermocouple passage 26 and the side surfaces of the thermocouple passage 26 extending in the longitudinal direction preferably have a C-surface or an R-surface to have no standing edges. The breadth of the thermocouple passage 26 at this time is preferably 9 mm or less. That is because, when the breadth is 9 mm or less, the outer peripheral thermocouple 50 is not easily distorted during insertion of the outer peripheral thermocouple 50, and the temperature measurement portion 50a of the outer peripheral thermocouple 50 is easily disposed at a desired measurement point (a point in the vicinity of the terminal end location 26d in the ceramic plate 20). The breadth of the thermocouple passage 26 is preferably larger than the outer diameter of the thermocouple guide 32 when the thermocouple guide 32 is to be inserted into the insertion port 26a of the thermocouple passage 26; however, when a clearance (a value obtained by subtracting the outer diameter of the thermocouple guide 32 from the breadth of the thermocouple passage 26) in the width direction is excessively large, accuracy in temperature measurement is degraded due to a loss of heat, it is thus preferable that the clearance in the width direction be set to 2 mm or less. Similarly, it is preferable that a clearance in the depth direction also be set to 2 mm or less. When the outer peripheral thermocouple 50 is to be inserted as it is without using the thermocouple guide 32, the breadth of the thermocouple passage 26 is preferably larger than the outer diameter of the outer peripheral thermocouple 50. However, for the same reason as above, it is preferable that the clearance (a value obtained by subtracting the outer diameter of the outer peripheral thermocouple 50 from the breadth of the thermocouple passage 26) in the width direction be set to 2 mm or less. Similarly, it is preferable that a clearance in the depth direction also be set to 2 mm or less.

Figure 7:
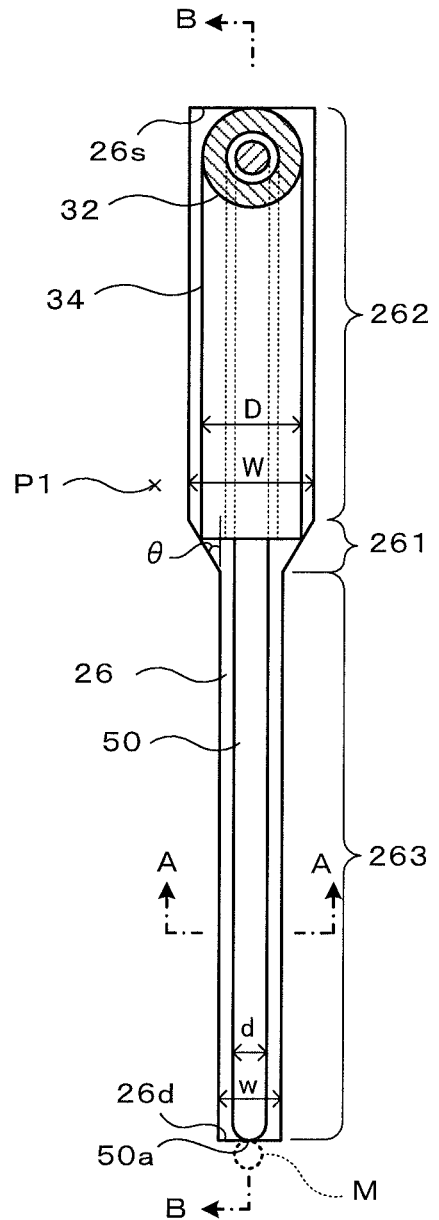
FIG. 7 is a rear view of the upper plate P1 provided with a passage groove 27 of another example.
Figure 8:
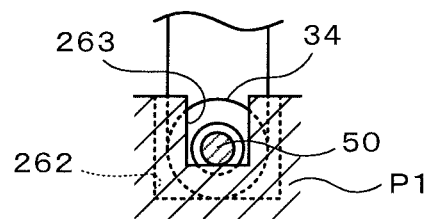
FIG. 8 is a sectional view taken along line A-A in FIG. 7.
Figure 9:
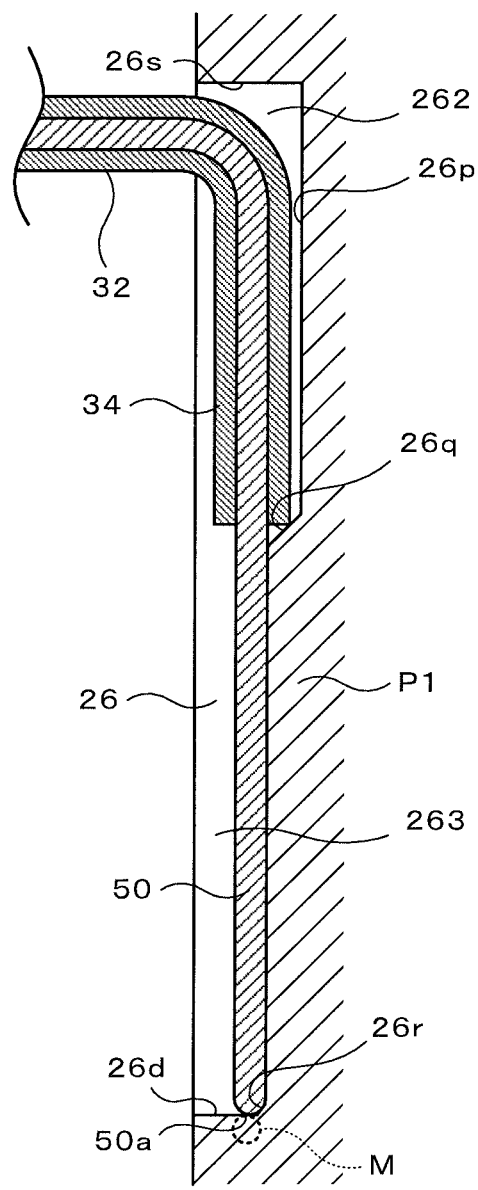
FIG. 9 is a sectional view taken along line B-B in FIG. 7.

In the above-described embodiment, a thermocouple passage 26 of another example illustrated in FIG. 7 to FIG. 9 may be employed as the thermocouple passage 26. FIG. 7 is a rear view of the upper plate P1 in which the thermocouple passage 26 of the other example is provided, and FIG. 8 is a sectional view taken along line A-A in FIG. 7, and FIG. 9 is a sectional view taken along line B-B in FIG. 7. In plan view, the thermocouple passage 26 includes a tapered portion 261 at a portion between a starting point 26s and the terminal end location 26d, a wide portion 262 from the starting point 26s to one end of the tapered portion 261, and a narrow portion 263 from the other end of the tapered portion 261 to the terminal end location 26d. Each of a width W of the wide portion 262 and a width w of the narrow portion 263 is preferably 9 mm or less. When each of the widths W and w is 9 mm or less, the outer peripheral thermocouple 50 is not easily distorted during insertion of the outer peripheral thermocouple 50, and the temperature measurement portion 50a is easily disposed at a desired measurement point M. When a bent tip portion 34 of the thermocouple guide 32 is to be disposed in the thermocouple passage 26, the width W of the wide portion 262 is preferably larger than an outer diameter D of the tip portion 34, and the width w of the narrow portion 263 is preferably larger than the outer diameter d of the outer peripheral thermocouple 50. However, for the same reason as above, it is preferable that a clearance (a value obtained by subtracting the outer diameter D of the tip portion 34 from the width W of the wide portion 262 and a value obtained by subtracting the outer diameter d of the outer peripheral thermocouple 50 from the width w of the narrow portion 263) of each of the wide portion 262 and the narrow portion 263 in the width direction be set to 2 mm or less. Similarly, it is preferable that a clearance in the depth direction also be set to 2 mm or less. At this time, when the tip portion 34 is in contact with the tapered portion 261, the tapered portion 261 plays a role of temporarily fixing the thermocouple guide 32, and the outer peripheral thermocouple 50 is thus more easily inserted into the narrow portion 263. The gradient θ of the tapered portion 261 is preferably set to 2° or more and 5° or less and more preferably set to 3° or more and 4° or less (for example) 3.4°. As illustrated in FIG. 9, a bottom surface 26p (the ceiling surface in FIG. 2) of the thermocouple passage 26 includes an inclined step 26q at a portion between the starting point 26s and the terminal end location 26d. The depth of the thermocouple passage 26 is deeper from the starting point 26s to the step 26q of the bottom surface 26p than the depth thereof from the step 26q to the terminal end location 26d. The boundary between the bottom surface 26p and the standing wall at the terminal end location 26d is an inclined surface 26r. The tip portion 34 of the thermocouple guide 32 is disposed in a part from the starting point 26s to the step 26q of the bottom surface 26p, and the outer peripheral thermocouple 50 is inserted along the part from the step 26q to the terminal end location 26d of the bottom surface 26p. Thus, it is possible to insert the outer peripheral thermocouple 50 into the thermocouple passage 26 smoothly by utilizing the thermocouple guide 32. Moreover, due to the presence of the inclined surface 26r, a gap between the temperature measurement portion 50a and the bottom surface 26p is small, and accuracy in temperature measurement of the temperature measurement portion 50a is thus improved. The bottom surface 26p of the thermocouple passage 26 may be a flat surface. When the outer peripheral thermocouple 50 is to be inserted as it is into the thermocouple passage 26 without using the thermocouple guide 32, the width W of the wide portion 262 and the width w of the narrow portion 263 are both preferably set to larger than the outer diameter d of the outer peripheral thermocouple 50. However, for the same reason as above, it is preferable that a clearance (a value obtained by subtracting the outer diameter d of the outer peripheral thermocouple 50 from the width W of the wide portion 262 and a value obtained by subtracting the outer diameter d of the outer peripheral thermocouple 50 from the width w of the narrow portion 263) of each of the wide portion 262 and the narrow portion 263 in the width direction be set to 2 mm or less. Similarly, it is preferable that a clearance in the depth direction also be set to 2 mm or less.

In the above-described embodiment, it is preferable that the outer diameter d of the outer peripheral thermocouple 50 be set to 0.5 mm or more and 2 mm or less. When the outer diameter d is less than 0.5 mm, the outer peripheral thermocouple 50 is bent when being inserted into the thermocouple passage 26, and insertion thereof to the terminal end location 26d becomes difficult. When the outer diameter d is more than 2 mm, the outer peripheral thermocouple 50 loses flexibility, and insertion of the outer peripheral thermocouple 50 to the terminal end location 26d becomes difficult.

Figure 10:
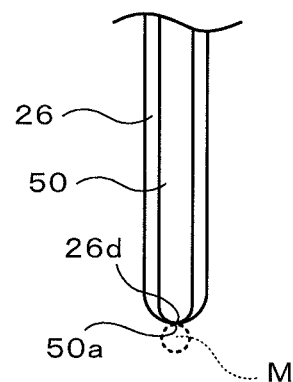
FIG. 10 is a plan view of another example of a temperature measurement portion 50a of an outer peripheral thermocouple 50 inserted into the thermocouple passage 26.
Figure 11:
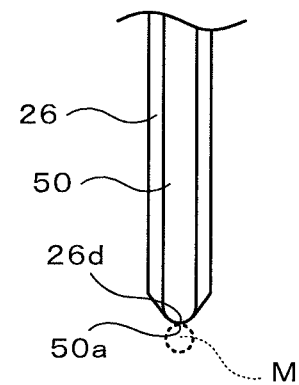
FIG. 11 is a plan view of another example of the temperature measurement portion 50a of the outer peripheral thermocouple 50 inserted into the thermocouple passage 26.

As illustrated in FIG. 10 and FIG. 11, in the above-described embodiment, the temperature measurement portion 50a of the outer peripheral thermocouple 50 may be a convex curved surface, and, of the terminal end surface (the standing wall at the terminal end location 26d) of the thermocouple passage 26, a part in contact with the temperature measurement portion 50a may be a concave curved surface. Consequently, the temperature measurement portion 50a of the outer peripheral thermocouple 50 is in surface contact with the terminal end surface, which is the desired measurement point M, of the thermocouple passage 26 or is in contact therewith in a state similar to surface contact. Thus, accuracy in temperature measurement is improved.

Figure 12:
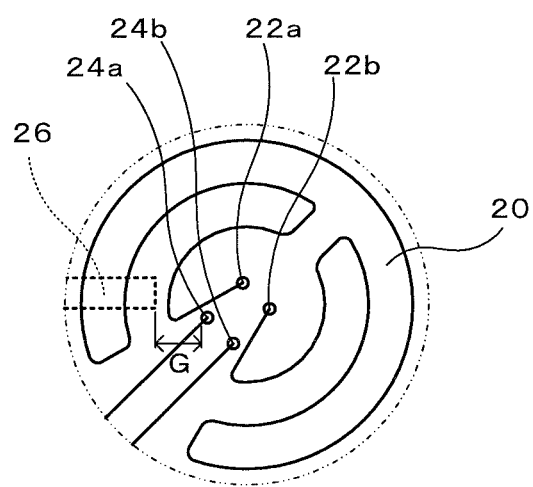
FIG. 12 is an illustration of a gap G between the thermocouple passage 26 and terminals 24a and 24b.

As illustrated in FIG. 12, in the above-described embodiment, it is preferable that a gap G between the thermocouple passage 26 and the terminals 22a, 22b, 24a, and 24b be set to 2 mm or more. Consequently, cracks can be prevented from being generated in the ceramic plate 20 due to an excessively narrow space between the thermocouple passage 26 and the terminals 22a, 22b, 24a, and 24b.

Figure 13:
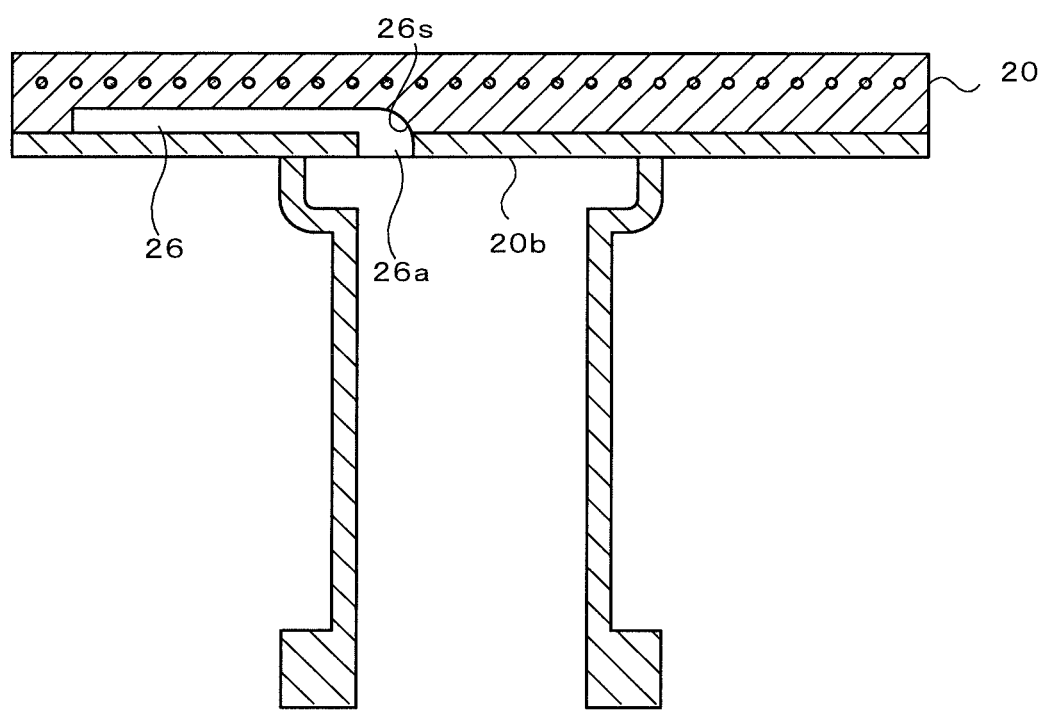
FIG. 13 is an illustration of another example of the thermocouple passage 26.

As illustrated in FIG. 13, in the above-described embodiment, the standing wall 26s on the side of the insertion port 26a of the thermocouple passage 26 may be curved from the rear surface 20b of the ceramic plate 20 toward the deep side of the thermocouple passage 26. Consequently, it is possible without using the thermocouple guide 32 to insert the outer peripheral thermocouple 50 into the thermocouple passage 26 smoothly by utilizing the curved standing wall 26s.

The above-described embodiment is also an example of a "ceramic heater including:

- a disk-shaped ceramic plate having a wafer placement surface;
- an outer peripheral resistance heating element incorporated in the ceramic plate and having a shape that extends out from one of a pair of terminals provided at a center portion of the ceramic plate to an annular outer peripheral zone of the ceramic plate and reaches the other of the pair of terminals after disposed in the outer peripheral zone while turning back at a plurality of turn-back portions;
- an outer peripheral thermocouple that measures a temperature of the outer peripheral zone by a temperature measurement portion provided at a tip of the outer peripheral thermocouple; and
- a thermocouple passage provided in an inner portion of the ceramic plate to be parallel to the wafer placement surface, the thermocouple passage extending from an insertion port to reach a terminal end location before an outer peripheral surface of the ceramic plate, the insertion port opening in a surface of the center portion of the ceramic plate, the surface being opposite to the wafer placement surface,
- in which the terminal end location is a location where the temperature measurement portion of the outer peripheral thermocouple is disposed,
- in which a height of the thermocouple passage is constant from the insertion port to the terminal end location, and
- in which a width of the thermocouple passage is a constant width W1 from the insertion port to a first intermediate location before the terminal end location, is a width gradually narrowed by a tapered surface from the first intermediate location to a second intermediate location on a deep side from the first intermediate location, and is a constant width W2 from the second intermediate location to the terminal end location.

The present application claims priority from Japanese Patent Application No. 2018-238224 filed Dec. 20, 2018, the entire contents of which are incorporated herein by reference.

What is claimed is:

1. A ceramic heater comprising:
    a disk-shaped ceramic plate having a wafer placement surface;
    an outer peripheral resistance heating element incorporated in the ceramic plate and having a shape that extends out from one of a pair of terminals provided at a center portion of the ceramic plate to an annular outer peripheral zone of the ceramic plate and reaches another of the pair of terminals after disposed in the outer peripheral zone while turning back at a plurality of turn-back portions; and
    an outer peripheral thermocouple that measures a temperature of the outer peripheral zone by a temperature measurement portion provided at a tip of the outer peripheral thermocouple,
    a thermocouple passage provided in an inner portion of the ceramic plate to be parallel to the wafer placement surface, the thermocouple passage extending from an insertion port to reach a terminal end location before an outer peripheral surface of the ceramic plate, the insertion port opening in a surface of the center portion of the ceramic plate, the surface being opposite to the wafer placement surface,
    wherein the terminal end location is a location where the temperature measurement portion of the outer peripheral thermocouple is disposed,
    a height of the thermocouple passage is constant from the insertion port to the terminal end location, and
    a width of the thermocouple passage is a constant width W1 from the insertion port to a first intermediate location before the terminal end location, is a width gradually narrowed by a tapered surface from the first intermediate location to a second intermediate location on a deep side from the first intermediate location, and is a constant width W2 from the second intermediate location to the terminal end location, and
    wherein, when the ceramic plate is viewed from the wafer placement surface, the temperature measurement portion is disposed at a location in the outer peripheral zone excluding a part where the turn-back portions of the outer peripheral resistance heating element face each other.

2. The ceramic heater according to claim 1,
    wherein the outer peripheral zone is divided into a plurality of circular-sector regions by a line segment connecting a center of the ceramic plate and each of the plurality of turn-back portions of the outer peripheral resistance heating element, and
    the location where the temperature measurement portion is disposed is provided inside an at least one of the plurality of circular-sector regions.

3. The ceramic heater according to claim 1,
    wherein the location where the temperature measurement portion is disposed is provided inside a width of the outer peripheral resistance heating element when the ceramic plate is viewed from the wafer placement surface.

4. The ceramic heater according to claim 1,
    wherein the width W2 is greater than or equal to 1.2 times and smaller than or equal to 2.2 times an outer diameter d of the outer peripheral thermocouple.

5. The ceramic heater according to claim 1,
    wherein the terminal end location is provided inside a width of the outer peripheral resistance heating element.

6. The ceramic heater according to claim 1,
    wherein the thermocouple passage is a passage having a substantially quadrangular cross-section, and a boundary between a ceiling surface and a side surface of the passage is an R-surface having a radius of curvature of 0.5 mm or more.

7. The ceramic heater according to claim 1,
    wherein a ceiling surface of the thermocouple passage includes an inclined step at an intermediate portion between the insertion port and the terminal end location, and a depth of the thermocouple passage from the insertion port to the step of the ceiling surface is deeper than a depth of the thermocouple passage from the step to the terminal end location.

8. The ceramic heater according to claim 1,
    wherein the temperature measurement portion of the outer peripheral thermocouple is a convex curved surface, and, of a terminal end surface of the thermocouple passage, a part in contact with the temperature measurement portion of the outer peripheral thermocouple is a concave curved surface.

9. The ceramic heater according to claim 1,
    wherein a gap between the thermocouple passage and each of the pair of terminals is 2 mm or more.

10. The ceramic heater according to claim 1, wherein a wall of the thermocouple passage on a side of the insertion port is curved from a rear surface of the ceramic plate opposite to the wafer placement surface toward a deep side of the thermocouple passage.

* * * * *